United States Patent [19]

Inoue

[11] Patent Number: 4,503,352
[45] Date of Patent: Mar. 5, 1985

[54] GROOVED PIEZOELECTRIC CERAMIC RESONATOR WITH TWO POLING DIRECTIONS

[75] Inventor: Jiro Inoue, Kanazawa, Japan

[73] Assignee: Murata Manufacturing Co., Ltd., Japan

[21] Appl. No.: 561,566

[22] Filed: Dec. 15, 1983

[30] Foreign Application Priority Data

Dec. 24, 1982 [JP]   Japan ................. 57-228138

[51] Int. Cl.³ ............................................. H01L 41/08
[52] U.S. Cl. ................................... 310/359; 310/320; 310/368; 310/366; 333/187
[58] Field of Search ............... 310/320, 321, 358, 359, 310/367, 368, 366; 333/186, 187, 197, 200

[56]   References Cited

U.S. PATENT DOCUMENTS

| | | | |
|---|---|---|---|
| 2,875,355 | 2/1959 | Petermann | 310/359 X |
| 3,374,367 | 3/1968 | Cowan | 310/359 |
| 3,562,792 | 2/1971 | Berlincourt et al. | 310/359 |
| 4,019,073 | 4/1977 | Vishnevsky et al. | 310/359 X |
| 4,368,402 | 1/1983 | Torii et al. | 310/359 X |
| 4,431,938 | 2/1984 | Inoue | 310/368 X |

FOREIGN PATENT DOCUMENTS

2163377  7/1977  Fed. Rep. of Germany ...... 310/359

Primary Examiner—Mark O. Budd
Attorney, Agent, or Firm—Ostrolenk, Faber, Gerb & Soffen

[57]  ABSTRACT

An improved piezoelectric ceramic resonator in which spurious vibration other than that in a longitudinal direction of a piezoelectric ceramic plate is suppressed. The directions of polarization of the rectangular piezoelectric ceramic plate at opposite sides of a concave groove provided in the piezoelectric ceramic plate are different from each other, and are unequal in magnitude. A portion of the plate between the oppositely polarized portions is not polarized in any predetermined direction. The resulting arrangement improves a spurious characteristic of the piezoelectric ceramic resonator, and also rectifies an imbalance in selectivity characteristic between a high frequency side and a low frequency side, when the resonator is used in an electrical filter.

6 Claims, 16 Drawing Figures

GROOVED PIEZOELECTRIC CERAMIC RESONATOR WITH TWO POLING DIRECTIONS

BACKGROUND OF THE INVENTION

The present invention generally relates to a piezoelectric resonator and more particularly, to an improved strip-shaped or rectangular piezoelectric ceramic resonator which utilizes a length vibration mode of a piezoelectric ceramic plate in a strip or rectangular configuration.

Figure 1A:
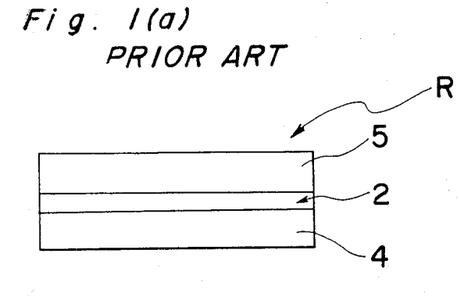
FIGS. 1(a), 1(b) and 1(c) respectively show a top plan view, a front elevational view and a side elevational view of a conventional piezoelectric ceramic resonator, discussed above.
Figure 1B:
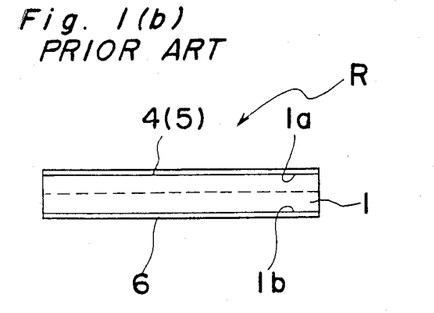
Figure 1C:
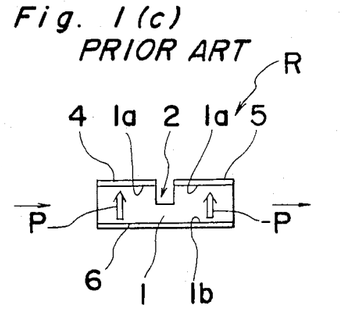

Conventionally, a strip-shaped or rectangular piezoelectric ceramic resonator(referred to as a rectangular piezoelectric ceramic resonator hereinafter), has been formed as a resonator R as shown in FIGS. 1(a), 1(b) and 1(c), which includes a rectangular piezoelectric ceramic plate 1 having an approximately constant width. In its one main surface is formed a concave groove 2 axially extending from one end to the other end thereof along its central portion in the widthwise direction so as to provide split electrodes 4 and 5 on said main surface 1a divided by said groove 2. An entire face electrode or common electrode 6 is formed over the other main surface 1b of the piezoelectric ceramic plate 1, with said piezoelectric ceramic plate 1 being subjected to polarization from the side of the entire face electrode 6 towards the split electrodes 4 and 5 in a direction as shown by symbols $\vec{P}$.

Incidentally, in the known piezoelectric ceramic resonator R as described above, disadvantages arise because an attenuation pole is provided at a low frequency side. Therefore selectivity at a high frequency side is inferior as compared with that at the low frequency side. Also, when the piezoelectric ceramic resonator is combined with an intermediate frequency transformer or more than two piezoelectric ceramic resonators of this kind are combined with each other, such imbalance in the sensitivity is increased, while comparatively strong spurious responses of a longitudinal vibration resonating in the widthwise direction of the piezoelectric ceramic plate 1 are produced. Thus, in the case where the piezoelectric ceramic resonator is applied, for example, to a short wave broadcasting receiver, beat troubles tend to take place due to such spurious responses.

SUMMARY OF THE INVENTION

Accordingly, an essential object of the present invention is to provide an improved piezoelectric ceramic resonator in which spurious vibration other than that in a longitudinal direction of a piezoelectric ceramic plate is suppressed. This is done by arranging directions of polarization of the rectangular piezoelectric ceramic plate to be different from each other at opposite sides of a concave groove provided in said piezoelectric ceramic plate for improving a spurious characteristic of the piezoelectric ceramic resonator. This arrangement is effective also for rectifying imbalance in selectivity characteristic between a high frequency side and a low frequency side, when the resonator is applied to an electrical filter.

Another important object of the present invention is to provide a piezoelectric ceramic resonator of the above described type, which is simple in construction and stable in functioning, and can be readily manufactured on a large scale at low cost.

In accomplishing these and other objects, according to one preferred embodiment of the present invention, there is provided a piezoelectric ceramic resonator which includes a rectangular piezoelectric ceramic plate of an approximately constant width having opposite main surfaces. The piezoelectric ceramic plate is formed, in one of its main surfaces, with a concave groove axially extending from one edge to the other edge thereof, split electrodes divided by the concave groove and formed on said one main surface, and an entire face electrode formed on the other of said main surfaces. The piezoelectric ceramic plate is subjected to polarization in a direction of its thickness, and in two directions opposite to each other, at a first portion thereof between one of the split electrodes and the entire face electrode, and at a second portion thereof between the other of the split electrodes and the entire face electrode.

By the arrangement of the present invention as described above, an improved piezoelectric ceramic resonator has been advantageously presented.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

Figure 2:
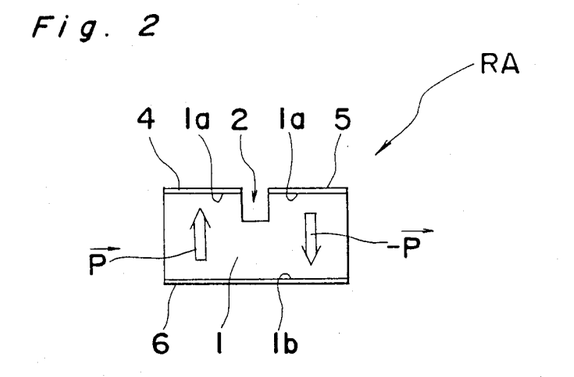
FIG. 2 is a side elevational view showing, on an enlarged scale, a piezoelectric ceramic resonator according to one preferred embodiment of the present invention for particularly illustrating the state of polarization thereof.

Referring now to the drawings, there is shown in FIG. 2 an improved rectangular piezoelectric ceramic resonator RA according to one preferred embodiment of the present invention. Parts in FIG. 2 which are like parts in FIGS. 1(a), 1(b) and 1(c) are designated by like reference numerals.

The piezoelectric ceramic resonator RA of the present invention in FIG. 2 has a construction generally similar to the conventional resonator R in FIGS. 1(a) to 1(c), and includes the rectangular piezoelectric ceramic plate 1 formed, in its one main surface 1a, with the concave groove 2 to provide the split electrodes 4 and 5 on the main surface 1a divided by said groove 2, and the entire face electrode or common electrode 6 formed over the other main surface 1b of the piezoelectric ceramic plate 1. However, in this resonator RA of FIG. 2, the portion of the piezoelectric ceramic plate 1 between the one electrode 4 as divided by the concave groove 2 on the one main surface 1a and the entire face electrode 6 on the other main surface 1b is subjected to polarization from said entire face electrode 6 towards the split electrode 4 in a direction as indicated by the symbol $\vec{P}$, while the portion thereof between the other split electrode 5 and the entire face electrode 6 is subjected to polarization from said split electrode 5 towards the entire face electrode 6 in an opposite direction as indicated by a symbol $-\vec{P}$.

Figure 3:
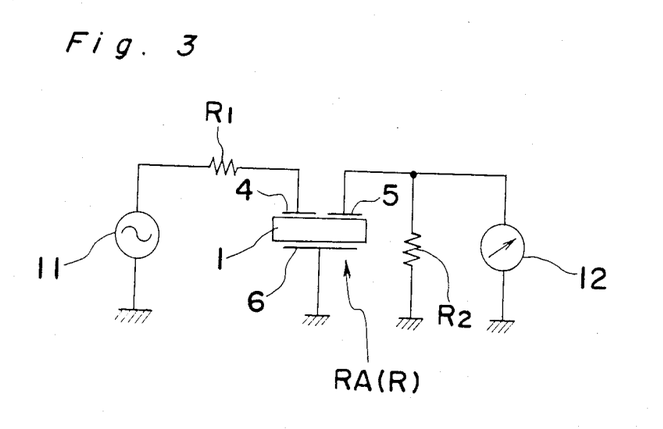
FIG. 3 is an electric circuit diagram of a circuit for measuring a selectivity characteristic and a spurious characteristic of one piezoelectric ceramic resonator.

The piezoelectric resonator RA of the present invention in which the piezoelectric ceramic plate 1 is subjected to the polarization in the two directions, represented by the symbols $\vec{P}$ and $\rightarrow P$ in the manner as described above, and the known piezoelectric resonator R in which the piezoelectric ceramic plate 1 is subjected to the polarization in the direction merely as shown by the symbol $\vec{P}$ as in the conventional arrangement of FIGS. 1(a) to 1(c), are prepared so as to be respectively measured for a selectivity characteristic and a spurious characteristic by a measuring circuit as illustrated in FIG. 3. Each of the resonators RA and R is connected in such a manner that the split electrode 4 is connected to the ground through a series connection of a resistor R1 of 3 KΩ and a standard signal generator (SSG) 11, and the split electrode 5 is connected to the ground through a parallel connection of a resistor R2 of 3 KΩ and a high frequency voltmeter 12, while the entire face electrode 6 is directly coupled to the ground.

Figure 4:
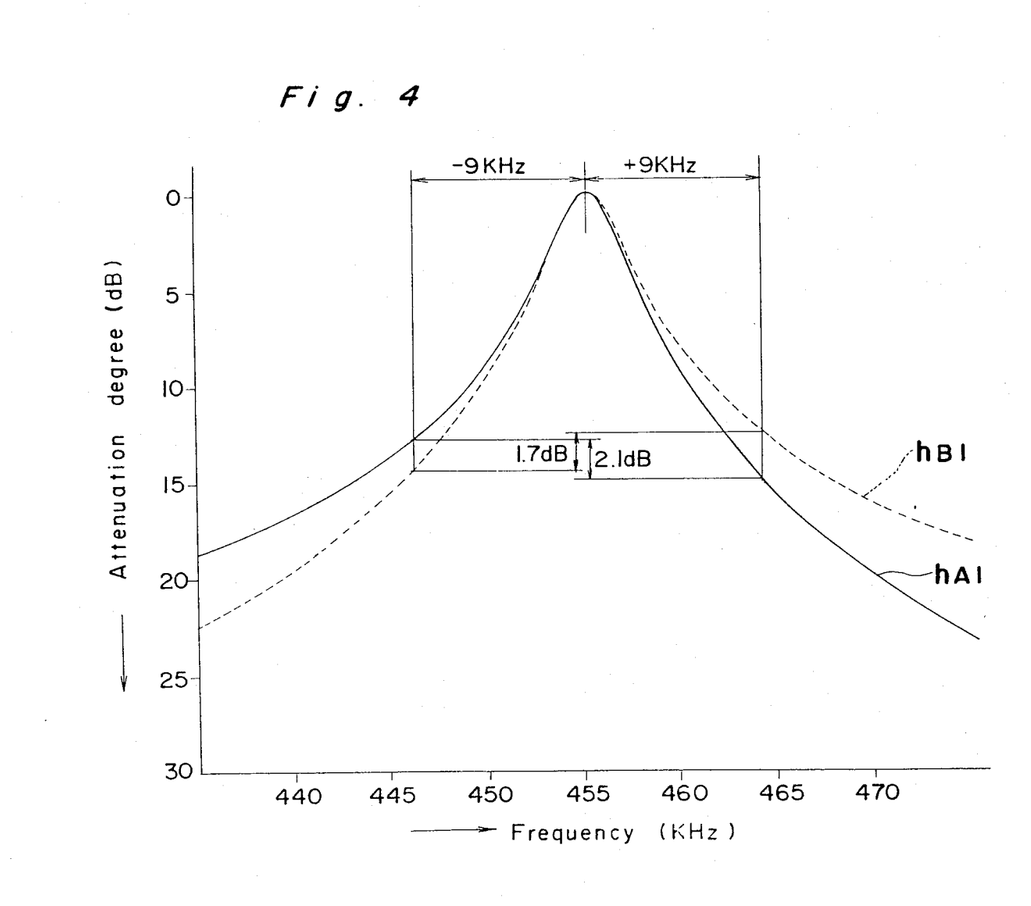
FIGS. 4 and 5 respectively show a selectivity characteristic diagram and a spurious characteristic diagram of the piezoelectric ceramic resonator as obtained by the measuring circuit of FIG. 3.
Figure 5:
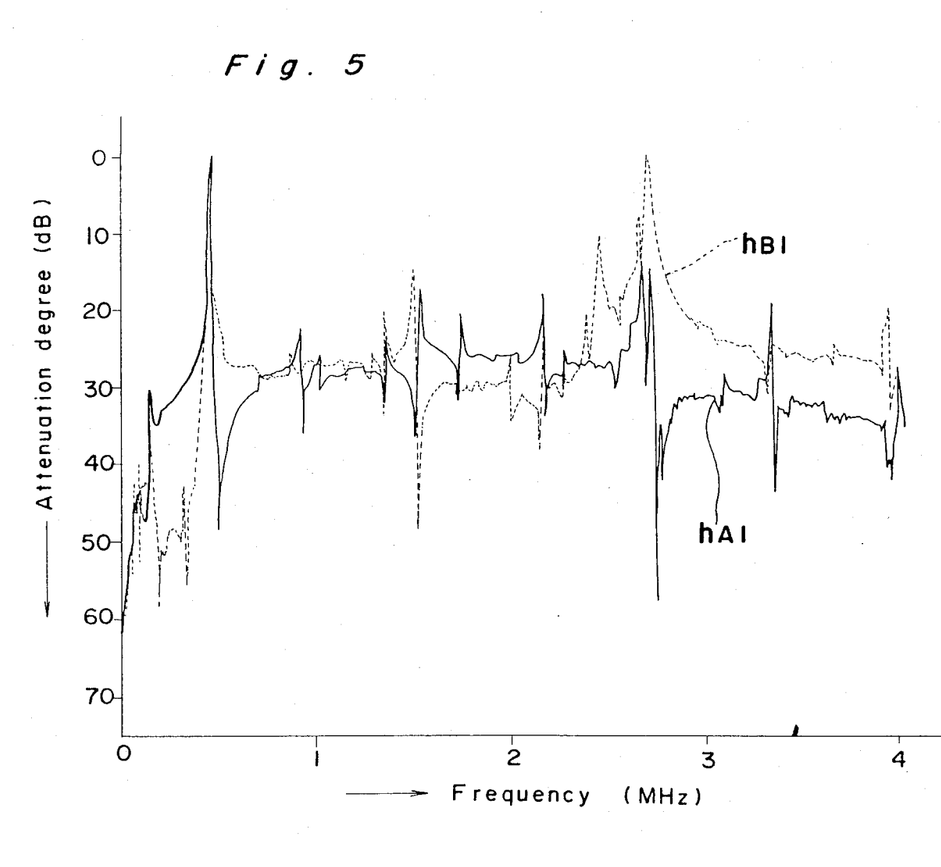

As a result of the above measurements, the selectivity characteristic and spurious characteristic as represented by curves hA1 respectively in FIGS. 4 and 5 were obtained for the resonator RA of the present invention, while those represented by curves hB1 respectively in FIGS. 4 and 5 were obtained with respect to the resonator R of the conventional construction.

Figure 6:
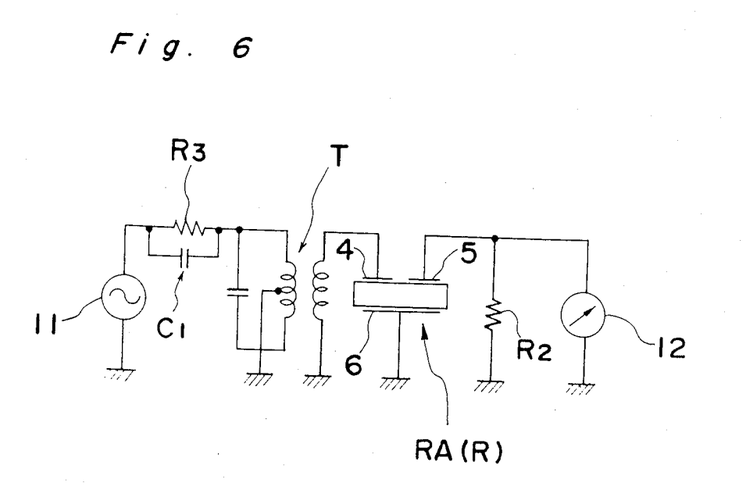
FIG. 6 is an electric circuit diagram for measuring a selectivity characteristic and a spurious characteristic of a circuit in which a piezoelectric resonator is combined with an intermediate frequency transformer.

Moreover, the piezoelectric ceramic resonators RA and R are each connected in series with an intermediate frequency transformer T as shown in FIG. 6, in which one winding of the transformer T is connected between the split electrode 4 and the ground, with the other winding thereof being coupled to a parallel connection of a resistor R3 having a resistance value of 300 KΩ and a capacitor C1 of 7 pF, and the standard signal generator 11 for the grounding, while the other connections are generally similar to those in FIG. 3.

Figure 7:
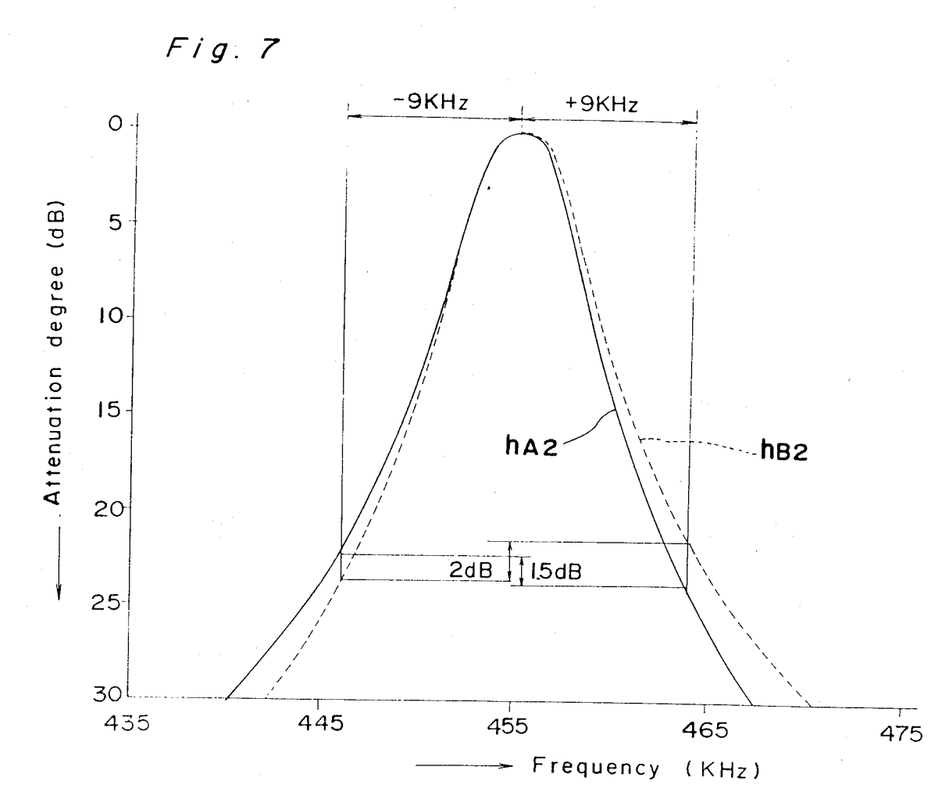
FIGS. 7 and 8 respectively show a selectivity characteristic diagram and a spurious characteristic diagram as obtained by the circuit of FIG. 6.
Figure 8:
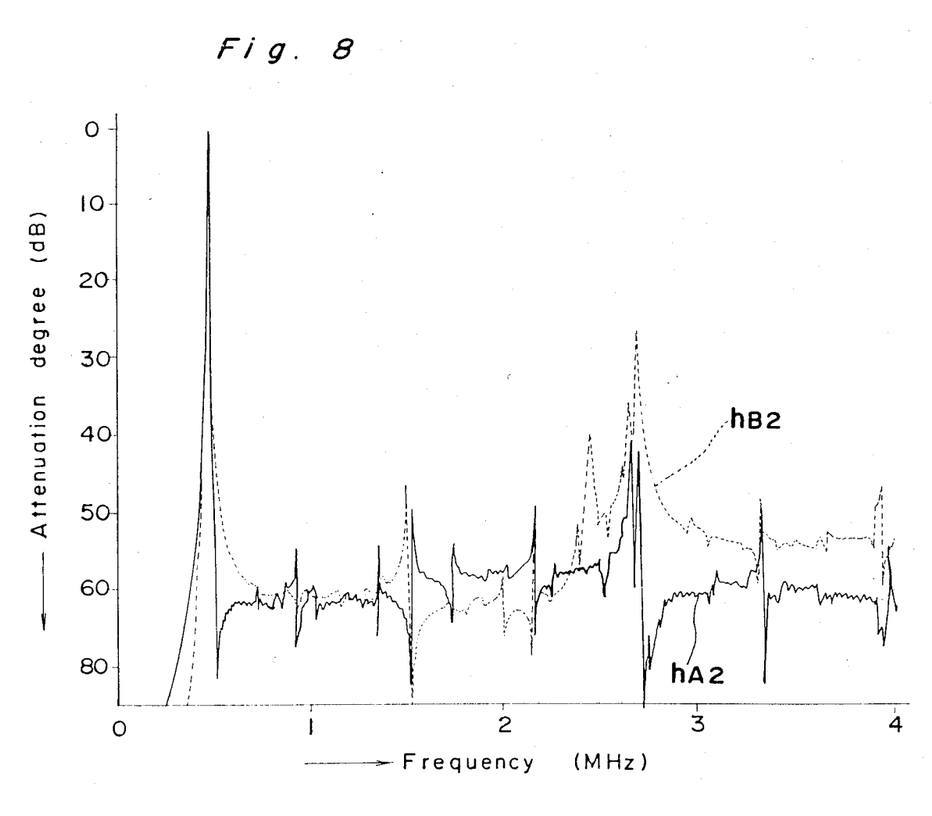

Upon measurements of the selectivity characteristic and the spurious characteristic by the connections as shown in FIG. 6, the selectivity characteristic and the spurious characteristic as represented by curves hA2 respectively in FIGS. 7 and 8 were obtained for the combination of the resonator RA with the intermediate frequency transformer T, while those represented by curves hB2 respectively in FIGS. 7 and 8 were obtained by the combination of the resonator R and the transformer T.

Figure 9:
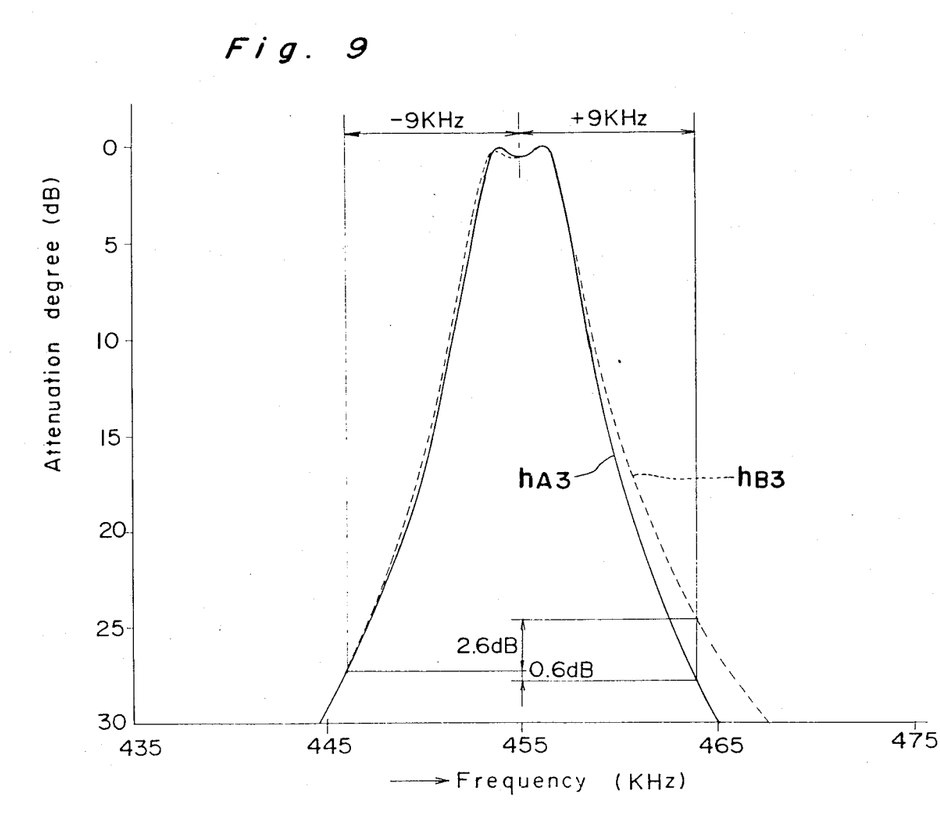
FIGS. 9 and 10 respectively show a selectivity characteristic diagram and a spurious characteristic diagram of an electrical filter in which two piezoelectric ceramic resonators are connected in series to each other.
Figure 10:
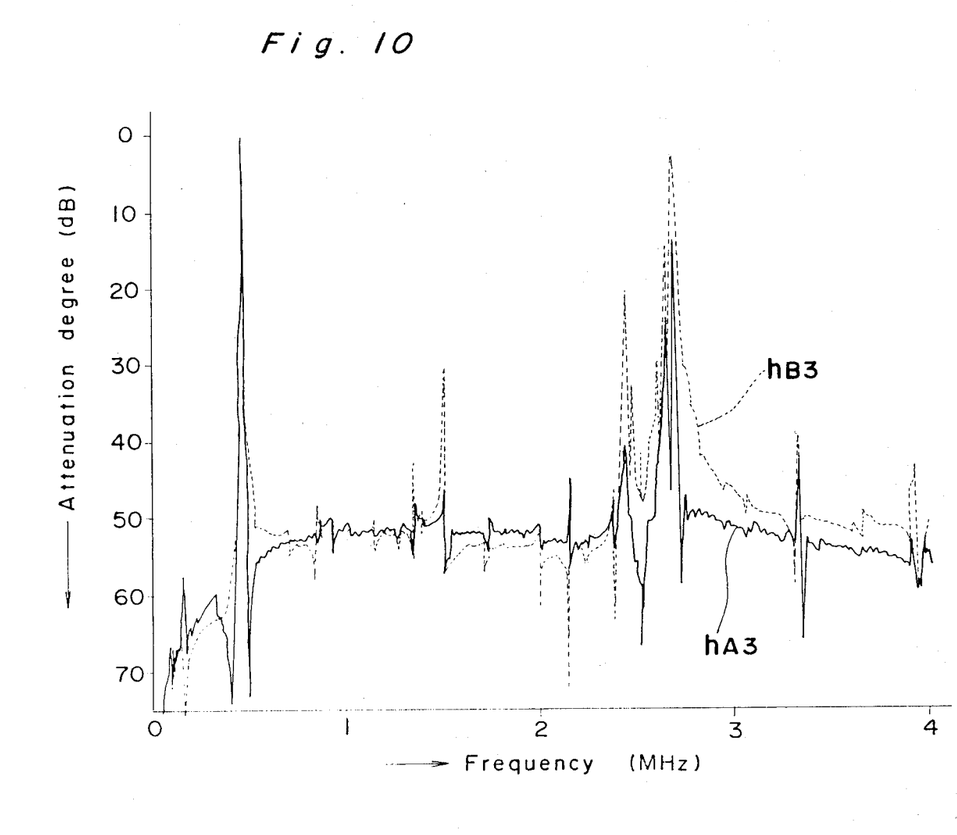

Meanwhile, in the case where the piezoelectric ceramic resonators RA and R were connected in series with each other in the measuring circuit of FIG. 3, the selectivity characteristic and the spurious characteristic represented by curves hA3 respectively in FIGS. 9 and 10 were obtained, while, in the case where the piezoelectric ceramic resonators R were connected in series with each other in two stages, those represented by curves hB3 respectively in FIGS. 9 and 10 were available.

Figure 11:
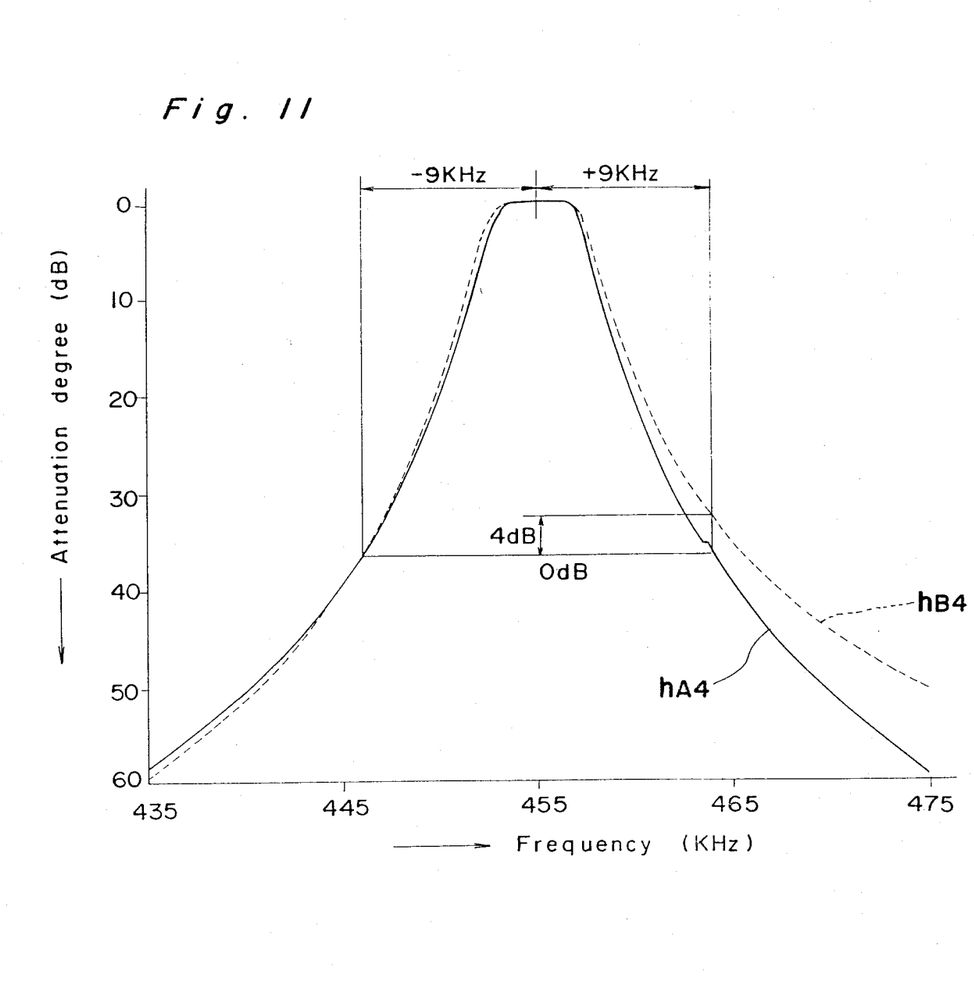
FIGS. 11 and 12 respectively show a selectivity characteristic diagram and a spurious characteristic diagram of an electrical filter in which two piezoelectric ceramic resonators are connected in series with an intermediate frequency transformer.
Figure 12:
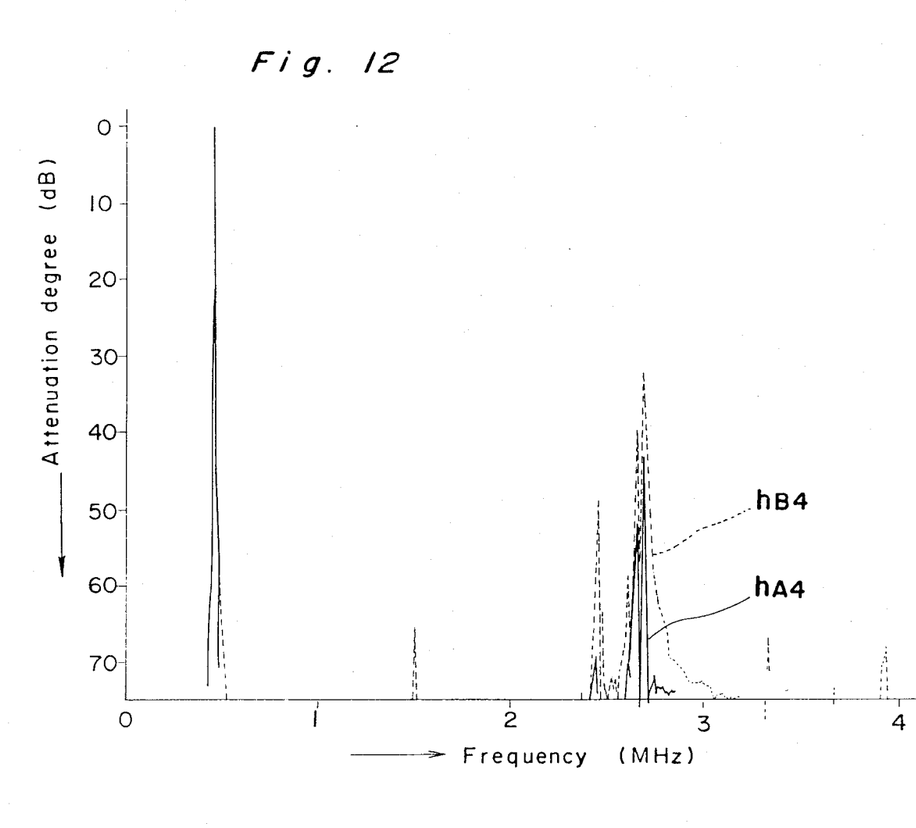

Furthermore, in the measuring circuit of FIG. 6, when the piezoelectric ceramic resonators RA and R were connected in series with each other, the selectivity characteristic and spurious characteristic respectively represented by curves hA4 in FIGS. 11 and 12 were obtained, while in the case where the piezoelectric ceramic resonators R were connected in series with each other for two stages, those respectively denoted by curves hB4 in FIGS. 11 and 12 were obtained.

As is seen from FIGS. 4 and 5, in the piezoelectric ceramic resonator RA according to the present invention, with respect to the characteristics in the vicinity of the center frequency, an attenuation pole is displaced to the high frequency side since the piezoelectric ceramic plate 1 is subjected to the inversion polarization represented by the symbols $\vec{P}$ and $-\vec{P}$ as described earlier, and thus, attenuation degree in a frequency range higher than the center frequency becomes larger than that in a frequency range lower than said center frequency.

On the other hand, the spurious response at approximately the same level as a main signal level has been improved to about −15 dB, while the spurious response at 2.7 MHz due to the longitudinal vibration in the widthwise direction of the piezoelectric ceramic substrate 1 and the spurious response at 2.45 MHz due to thickness shear vibration mode of the piezoelectric ceramic substrate 1 as excited by a parallel electric field have been eliminated.

The reason for the disappearance of the spurious response at 2.7 MHz is that, in the piezoelectric ceramic resonator R in which the piezoelectric ceramic plate 1 is subjected to the polarization merely as shown by the symbol $\vec{P}$, when electric fields in the same direction with respect to the common electrode 6 are applied to the split electrodes 5 and 4, the longitudinal vibration in the widthwise direction of the piezoelectric ceramic plate 1 is excited in the vicinity of 2.7 MHz. On the other hand, the piezoelectric ceramic resonator RA according to the present invention is produced by subjecting the piezoelectric ceramic plate 1 to the inversion polarization in the direction of the symbol $-\vec{P}$ after once subjecting said plate 1 to the polarization uniformly in the direction of $\vec{P}$. Therefore, even when the electric field in the opposite directions with respect to the common electrode 6 are applied to the split electrodes 5 and 4, they are not excited so much as in the case where the electric fields in the same direction with respect to the common electrode 6 are applied to the split electrodes 5 and 4 of the conventional piezoelectric ceramic resonator R.

Meanwhile, the reason for the disappearance of the spurious response at 2.45 MHz is that, in the piezoelectric ceramic resonator RA of the present invention, since the portion of the piezoelectric ceramic plate 1 between the bottom portion of the concave groove 2 and the common electrode 6 has not been subjected to polarization in a predetermined direction, even if an electric field component in the direction at right angles with the directions of $\vec{P}$ or $-\vec{P}$ is applied to such portion, the the thickness shear vibration mode vibration of the piezoelectric ceramic plate 1 is not excited.

As is understood from the foregoing description, in the piezoelectric ceramic resonator RA of the present invention, both the selectivity characteristic and the spurious characteristic have been appreciably improved as compared with the conventional piezoelectric ceramic resonator R.

Figure 13A:
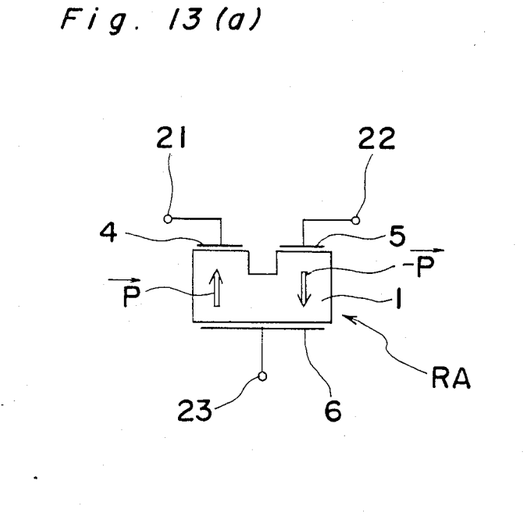
FIG. 13(a) is a side elevational view of the piezoelectric ceramic resonator of the present invention as applied to a three terminal type resonator.
Figure 13B:
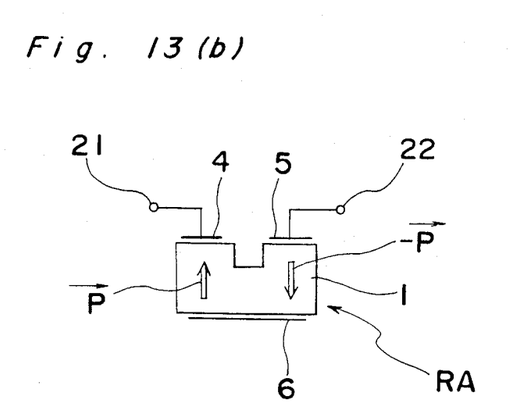
FIG. 13(b) is also a side elevational view of the piezoelectric ceramic resonator of the present invention as applied to a two terminal type resonator.

It should be noted here that the piezoelectric ceramic resonator RA of the present invention may be used as a three terminal type resonator as shown in FIG. 13(a), in which the split electrodes 4 and 5 are respectively connected to an input and an output terminals 21 and 22, with the entire face electrode 6 being connected to a ground terminal 23, and also, as a two terminal type resonator as shown in FIG. 13(b), in which the split electrodes 4 and 5 are connected to the input and the output terminals 21 and 22 in a similar manner, but without any connection to the entire face electrode 6.

It should also be noted that the present invention may be widely applied to piezoelectric ceramic resonators such as ceramic oscillators, resonators for FM discriminators, etc. besides the application thereof to the filter.

As is clear from the foregoing description, according to the present invention, the piezoelectric ceramic plate provided with the concave groove is subjected to the polarization in the direction of its thickness at both sides of said concave groove respectively in opposite directions $\vec{P}$ and $-\vec{P}$ to each other so as to suppress generation of spurious vibration in directions other than the lengthwise direction of the piezoelectric ceramic plate. Therefore, if the present invention is applied to electrical filters, a filter superior in the spurious characteristic may be obtained. Moreover, according to the present invention, since the attenuation pole is displaced towards the high frequency side with respect to the center frequency, a filter having a symmetrical selectivity characteristic may be obtained through combination with a conventional piezoelectric ceramic resonator having an attenuation pole towards the low frequency side with respect to the center frequency or in combination with an intermediate frequency transformer.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A piezoelectric ceramic resonator for vibrating in a length vibration mode, comprising:

a rectangular piezoelectric ceramic plate having first and second axially opposite ends and an approximately constant width between said first and second ends; said plate having first and second opposite main surfaces and a thickness therebetween; said plate further having a groove defined in said first main surface, said first main surface having first and second parts on opposite sides of said groove, said groove extending axially between said first and second ends for separating said first and second parts; said plate including a first portion between said first part of said first main surface and said second main surface, a second portion between said second part of said first main surface and said second main surface and a third portion between said first and second portions and between said groove and said second main surface; said first portion being polarized in a first direction along said thickness of said plate to a first degree; said second portion being polarized in a second direction opposite said first direction to a second degree less than said first degree; said third portion not being polarized in any predetermined direction;

first and second split electrodes formed on said first and second parts of said first main surface; and an entire face electrode formed on said second main surface.

2. A piezoelectric ceramic resonator as claimed in claim 1, wherein said first and second split electrodes are respectively connected to an input terminal and an output terminal, said entire face electrode being connected to a ground terminal for application as a three terminal type resonator.

3. A piezoelectric ceramic resonator as claimed in claim 1, wherein said first and second split electrodes are respectively connected to an input terminal and an output terminal, said entire face electrode having no connection, for application as a two terminal type resonator.

4. A piezoelectric ceramic resonator, comprising:

a rectangular piezoelectric ceramic plate having first and second axially opposite ends and an approximately constant width between said first and second ends; said plate having first and second opposite main surfaces and a thickness therebetween; said plate further having a groove defined in said first main surface, said first main surface having first and second parts on opposite sides of said groove, said groove extending axially between said first and second ends for separating said first and second parts; said plate including a first portion between said first part of said first main surface and said second main surface, a second portion between said second part of said first main surface and said second main surface and a third portion between said first and second portions and between said groove and said second main surface; said first portion being polarized in a first direction along said thickness of said plate; said second portion being polarized in a second direction opposite said first direction; said third portion not being polarized in any predetermined direction;

first and second split electrodes formed on said first and second parts of said first main surface; and an entire face electrode formed on said second main surface.

5. A piezoelectric ceramic resonator as claimed in claim 4, wherein said first and second split electrodes are respectively connected to an input terminal and an output terminal, said entire face electrode being connected to a ground terminal for application as a three terminal type resonator.

6. A piezoelectric ceramic resonator as claimed in claim 4, wherein said first and second split electrodes are respectively connected to an input terminal and an output terminal, said entire face electrode having no connection, for application as a two terminal type resonator.

* * * * *